(12) United States Patent
Del Rosario et al.

(10) Patent No.: US 7,906,734 B2
(45) Date of Patent: Mar. 15, 2011

(54) ELECTRICAL TERMINAL FOOTPRINTS FOR A PRINTED CIRCUIT BOARD

(75) Inventors: Rod Del Rosario, Cupertino, CA (US);
John Nguyen, San Jose, CA (US);
Anton Rahardja, San Jose, CA (US)

(73) Assignee: MCDATA Corporation, San Jose, CA (US)

( * ) Notice: Subject to any disclaimer, the term of this patent is extended or adjusted under 35 U.S.C. 154(b) by 297 days.

(21) Appl. No.: 11/669,070

(22) Filed: Jan. 30, 2007

(65) Prior Publication Data
US 2008/0179083 A1     Jul. 31, 2008

(51) Int. Cl.
H05K 1/11     (2006.01)
(52) U.S. Cl. .......................... 174/262; 174/261
(58) Field of Classification Search ............... 174/261, 174/262, 260; 361/767, 760; 257/E23.67
See application file for complete search history.

(56) References Cited

U.S. PATENT DOCUMENTS

| | | | |
|---|---|---|---|
| 6,271,481 B1* | 8/2001 | Goenka et al. | 174/261 |
| 6,383,603 B1* | 5/2002 | Nojioka | 428/132 |
| 2005/0162839 A1* | 7/2005 | Chan et al. | 361/782 |
| 2006/0166398 A1* | 7/2006 | Chan | 438/106 |
| 2007/0177364 A1* | 8/2007 | Larsen et al. | 361/760 |
| 2008/0205011 A1* | 8/2008 | Chan et al. | 361/767 |
| 2009/0014206 A1* | 1/2009 | Motohashi et al. | 174/262 |

OTHER PUBLICATIONS

Hisaki, Toshikuni, Shrinking Dimensions Typify Today's Multilayer Ceramic Capacitors, The American Enterprise Institute for Public Policy Research, AEI Press, Nov. 2005, 3 pages, Copyright 2005, Dempa Publications, Inc.

Taiyo Yuden, Products: Ceramic Capacitor Overview, 3 pages, Retrieved from website using Internet URL: <http://www.t-yuden.com/capacitors/>, Copyright 1998-2004 Taiyo Yuden (U.S.A.), Inc.
Vishay Intertechnology, Inc., High Performance, High Precision Wire-Bondable 0402 Capacitor for Smartcard, High-Frequency and Substrate-Embedded Application, Product Specifications for HPC0402B/C, 3 pages, document No. 10120, revised Aug. 9, 2006.
Post, Andrew, Industry's Lowest-Profile (0.18 mm-height) 0402 Capacitors Introduced by Vishay, 2 pages, Oct. 25, 2002, Vishay Intertechnology, Inc. Press Release, Retrieved from website using Internet URL: <http://www.vishay.com/company/press/releases/2002/021025capacitors/?print>, Malvern Pennsylvania.
"PowerPC Embedded Processors Application Note—PowerPC 740/750: Power Notes," IBM Microelectronics, Mar. 3, 1999, Version 1.1, 4 pages.
Brocade Communications Systems, Inc., screenshot of PBC assembly drawing dated Nov. 19, 2003 with enlarged images, 3 pages, publication date unknown.

* cited by examiner

Primary Examiner — Yuriy Semenenko
(74) Attorney, Agent, or Firm — Hensley Kim & Holzer, LLC

(57) ABSTRACT

In one implementation, a PCB having an array of vias and electrical terminals disposed on the side of the PCB opposite the side configured to receive a grid array package are disclosed herein. The array of vias have pads and forms a pattern of repetitive rows and columns. A substantially consistent intervia distance is defined along an intervia axis between each adjacent via in each of the rows and columns. A pair of electrical terminals are positioned adjacent one another along an electrical terminal axis between at least two of the vias and the electrical terminal axis intersects the intervia axis. In another implementation, a group of four adjacent vias form a substantially rectangular shape having one of four vias positioned at each of four corners of the rectangular shape. One electrical terminal is positioned within the four vias without contacting any of the four vias.

24 Claims, 5 Drawing Sheets

ELECTRICAL TERMINAL FOOTPRINTS FOR A PRINTED CIRCUIT BOARD

BACKGROUND

Dense and high speed printed circuit board (PCB) designs require electrical components (i.e. capacitors, resistors, inductors, etc.) be placed as close as possible to active components (i.e. ASIC's, FPGA's, SERDES, etc.) to reduce noise and optimize signal quality. PCBs having these active components typically have a high pin count and have limited physical space available for placing such components within the footprint (e.g. within active components and/or within an array of vias) on the PCB.

To fit the necessary electrical components within the limited available space on the PCB footprint, designers may utilize electrical components having very small dimensions. These small electrical components are commonly used with good results in devices having less complex PCB designs, such as in higher volume, lower complexity consumer devices, such as cell phones, PDA's, cameras, etc. However, problems may arise when utilizing these small electrical components in devices having larger and more complex PCB designs.

Thus, it would be advantageous to place these small electrical components within the active components and within the limited space available on the footprint of a PCB in devices having larger and more complex PCB designs.

SUMMARY

In a first exemplary implementation, a printed circuit board (PCB) includes an array of vias and a pair of electrical terminals. The array of vias have pads on a side of the PCB opposite the side of the PCB configured to receive a grid array package. The array of vias forms a pattern of repetitive rows and columns of vias. A substantially consistent intervia distance is defined along an intervia axis between each adjacent vias in each of the rows and columns. The pair of electrical terminals are also disposed on the side of the PCB opposite the side configured to receive the grid array package. The pair of electrical terminals are positioned adjacent one another along an electrical terminal axis between at least two of the vias and such that the electrical terminal axis intersects the intervia axis.

In a second exemplary implementation, a PCB comprises an array of vias and a first electrical terminal. The array of vias have pads on a side of the PCB opposite the side of the PCB configured to receive a grid array package. The array of vias forms a consistent pattern of repetitive rows and columns of vias and a group of four adjacent vias form a substantially rectangular shape having one of the four vias positioned at each of four corners of the rectangular shape. The first electrical terminal is also disposed on the side of the PCB opposite the side configured to receive the grid array package. The first electrical terminal is positioned within the group of four vias forming the rectangular shape without contacting any of the four vias.

In another implementation, a method of forming a PCB includes forming an array of vias and disposing a pair of electrical terminals. The array of vias are formed within the PCB such that the vias have pads on a side of the PCB opposite the side of the PCB configured to receive a grid array package. The array of vias form a pattern of repetitive rows and columns and a substantially consistent intervia distance is defined along an intervia axis between each adjacent vias in each of the rows and columns. The pair of electrical terminals are also disposed on the side of the PCB opposite the side configured to receive the grid array package and are positioned adjacent one another along an electrical terminal axis between at least two of the vias and intersecting the intervia axis.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. It should also be understood that, although disc drive implementations are described here, the described technology may be applied to other systems.

BRIEF DESCRIPTION OF THE DRAWINGS

Illustrative and presently preferred embodiments of the invention are illustrated in the drawings, in which.

DETAILED DESCRIPTION

Figure 1:
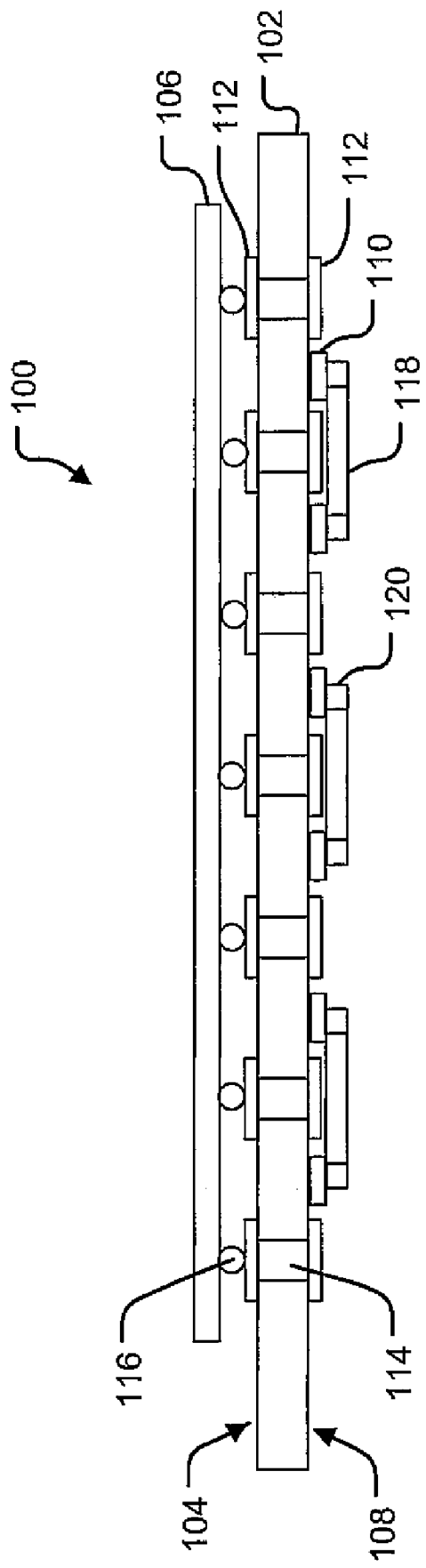
FIG. 1 illustrates a cross-sectional view of an exemplary PCB having a grid array package on one side and having electrical terminals and electrical components disposed on an opposite side.

FIG. 1 illustrates a printed circuit board (PCB) 102 having a first side 104 configured to be coupled to a grid array package 106 and a second side 108 configured to receive electrical terminal footprints 110 thereon. One side of the PCB 102, such as the first side 104 or top side as shown in FIG. 1, may be configured to receive the grid array package 106. By way of example, the grid array package 106 may be a ball grid array (BGA) package, as shown in FIG. 1. However, the grid array package 106 could also take other forms (such as that of a land grid array (LGA) package).

The grid array package 106 is attached to the PCB 102 at a number of pads (e.g., pad 112) on one side of the PCB 102. The pads (e.g., 112) to which the package 106 is attached are coupled to a plurality of breakout vias 114 that present from side 104 through side 108 of the PCB 102. For purposes of illustration, each of the breakout vias 114 is shown to be bounded above and below by a somewhat thick pad (e.g., pads 112). Typically, however, these pads 112 will be very thin. Also, FIG. 1 shows that each of the breakout vias 114 is a through-hole type via. Although through-hole vias reduce the lengths of electrical paths between the package 106 and the electrical terminal footprints 110, the vias 114 need not be through-hole vias, and could for example, traverse only some of the layers of the PCB 102. In this case, the breakout vias would not extend to package 106, and would instead be coupled to package 106 by means of internal traces and/or other vias of PCB 102. Also, if the breakout vias 114 are not through-hole type vias, they may not be vertically aligned with the contacts (e.g., solder balls 116) of package 106, as shown in FIG. 1.

Electrical terminals or electrical terminal footprints 110 are disposed on the side 108 of the PCB 102 opposite the side 104 configured to receive the package 106, often called the backside (side 108) of the PCB 102. These electrical terminal footprints 110 may be formed on the surface of the PCB 102 using a variety of techniques, including etching, masking, or use of resist patterns, just to name a few examples. Electrical terminal footprints 110 are typically very thin, but are shown as being somewhat thick in FIG. 1 for purposes of illustration. These electrical terminal footprints 110 may each comprise an irregular hexagonal shape and may be positioned in pairs, as will be described below in more detail.

These electrical terminal footprints 110 are further configured to receive electrical components 118 thereon. The electrical terminal footprints 110 electrically couple the electrical components 118 to the PCB 102. The electrical components 118 may have end portions dipped in a solder or tin material so that they can be soldered or otherwise electrically coupled to the electrical terminal footprints 110. The electrical components 118 may include resistors, capacitors, or inductors, just to name a few examples, and may be deposited on the electrical terminals to bridge, or electrically couple (via solder terminals 120) a pair of electrical terminals 110 together, as shown in FIG. 1.

Figure 2:
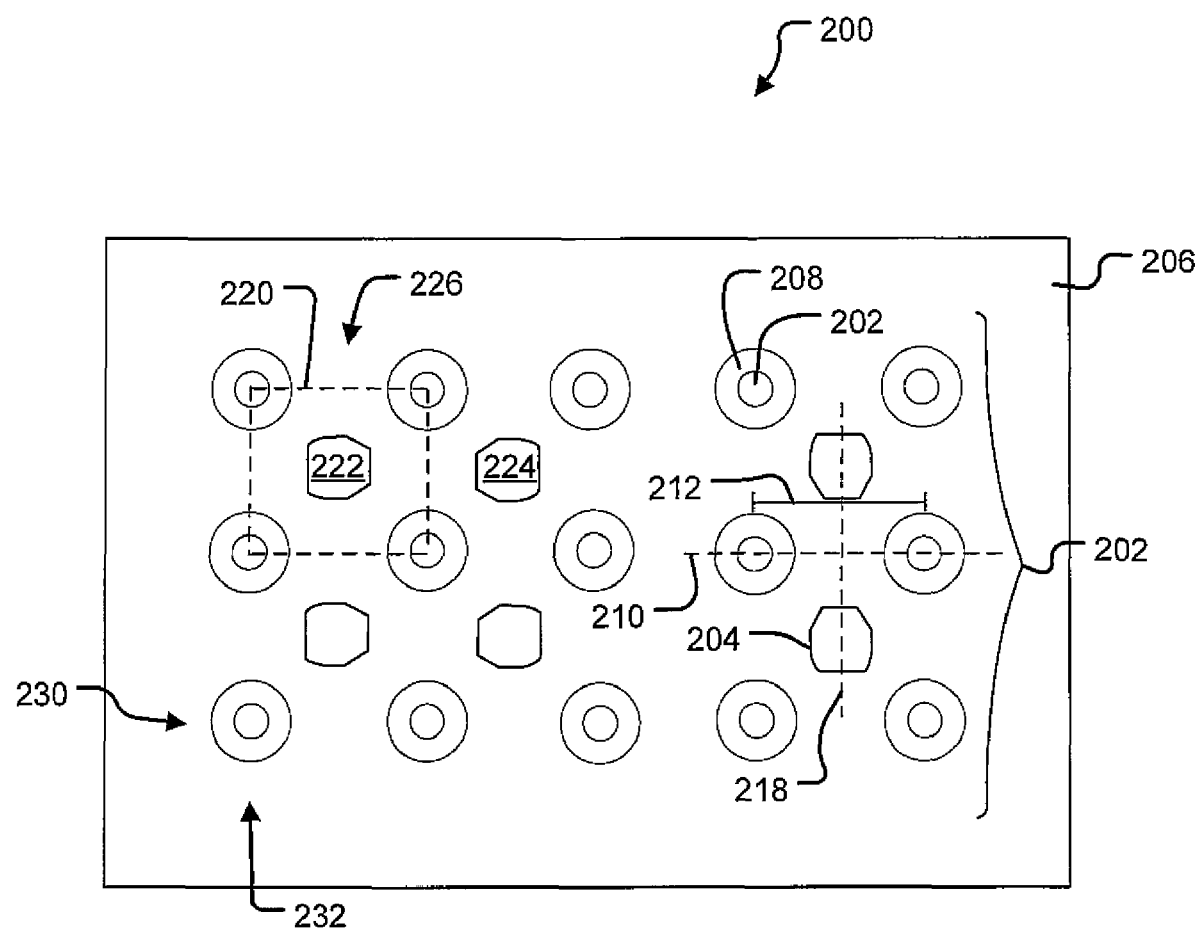
FIG. 2 illustrates a view of an exemplary PCB having electrical terminals thereon.

FIG. 2 illustrates a view 200 of a side of a PCB 206 having an array of vias 202 and electrical terminals 204 positioned thereon. The array of vias 202 and the electrical terminals 204 are disposed on the side of the PCB 206 opposite the side of the PCB 206 configured to receive a package (not shown in FIG. 2). The side of the PCB 206 which is not configured to receive a package or other device is typically called the backside of the PCB 206 and often has more available space to receive active components (e.g. an array of vias 202) thereon.

Also shown in FIG. 2, the array of vias 202 have exposed pads (shown as outer circles 208) and form a substantially consistent pattern of repetitive rows 230 and columns 232. The continuous pattern of rows 230 and columns 232 formed by the array of vias 202 is a substantially uninterrupted or unbroken pattern of rows 230 and columns 232, wherein each row 230 and each column 232 have substantially similar spacing. Each adjacent via 202 in any of the rows 230 and columns 232 are separated by a substantially consistent distance, defined as the intervia distance 212 herein. The substantially consistent intervia distance 212 is defined along an intervia axis 210 between each adjacent via in each of the rows 230 and columns 232. The intervia axis 210 is an axis which intersects any two adjacent vias in any of the rows 230 and columns 232, as shown in FIG. 2. An adjacent via refers to the closest via or vias in the array.

It is within this continuous pattern of rows 230 and columns 232 of vias 202, that an electrical terminal 204 is disposed. A single electrical terminal 204 may be paired with an adjacent, or the next closest electrical terminal 204, to form a pair of electrical terminals 204. As shown in FIG. 2, the electrical terminals 204 may be positioned together as a matched pair (both shown as 204). The pair of electrical terminals 204 are positioned adjacent one another (i.e. next to one another), along an electrical terminal axis 218 and between at least two of the vias 202.

The electrical terminal axis 218 is an axis which intersects the pair of electrical terminals 204, as shown in FIG. 2. The pair of electrical terminals 204 forming the electrical terminal axis 218 are positioned within the array of vias 202 such that the electrical terminal axis 218 intersects or crosses the intervia axis 210, as shown in FIG. 2. In some implementations, the electrical terminal axis 218 may be positioned perpendicularly to the intervia axis 210, as shown in FIG. 2. The electrical terminals 204 are positioned within the array of vias 202 without contacting any of the vias 202 in the array 202 to comply with electrical tolerances of the array of vias 202. The electrical terminals 204 are configured to receive electrical components thereon (described in more detail below with reference to FIG. 3).

With continuing reference to FIG. 2, described from another perspective, the array of vias 202 form a consistent pattern of rows 230 and columns 232, such that a group 226 of four adjacent vias 202 form a substantially rectangular or square shape 220. As shown in FIG. 2, the pattern of rows 230 and columns 232 of vias 202 may be viewed in groups 226 of four vias 202 forming the substantially rectangular or square shape 220, wherein one of the four vias 226 is positioned at each of the four corners of the rectangular or square shape 220. From this perspective, a first electrical terminal 222 is positioned within the group 226 of four vias 202 forming the rectangular or square shape 220 without contacting any of the four vias 226.

Positioning the first electrical terminal 222 within the group 226 of four vias 202 without contacting any of the four vias 202 helps ensure compliance with electrical tolerances of the vias 202 and the PCB to ensure proper operation of the electrical terminal 222. In one implementation, the first electrical terminal 222 is positioned substantially centered within the group 226 of four vias 202, as shown in FIG. 2. However, the first electrical terminal 222 does not need to be substantially centered, as long as it remains spaced apart from the vias 202 at a distance sufficient to satisfy electrical tolerances. For example, if the first electrical terminal 222 is positioned too close to one of the vias 202, it may interfere with signals routed though that via 202 and or may cause an electrical short, resulting in a defective PCB 206.

In one exemplary implementation, each of the vias 202 in each of the rows 230 and columns 232 of vias in an array may be separated by a 1 mm pitch. In this example, it may be desirable to provide a minimum distance of 0.13 mm between each electrical terminal (such as 204 or 222) and its adjacent via(s) 202.

As shown in FIG. 2, the electrical terminals 204 may be arranged in pairs, such as shown by pair 222 and 224, as described above. The shape of these electrical terminals 204 also provides a number of important advantages for placing the electrical terminals 204 within the active components (e.g. an array 202) on a PCB 206, without contacting any of the adjacent vias 202 and without violating electrical tolerances of the active components. As shown in FIG. 2, the electrical terminals 204 have an outer perimeter which forms a polygon having an irregular shape. More specifically, the electrical terminals 204 may have an irregular hexagonal shape, having six sides with some corners and/or edges being slightly rounded. The irregular hexagon shape and the rounding of the corners provide an electrical terminal footprint 204 having a substantial surface area which can be positioned within the active components (e.g. an array 202) without being too close to the active components. In one implementation, as shown in FIG. 2, these electrical terminals 204 may be positioned in pairs having their short ends facing one another, such that the irregular hexagonal shapes form mirror images of one another. Of course the precise sizes and shapes of these electrical terminals 204 may vary depending upon the specific active components.

Figure 3:
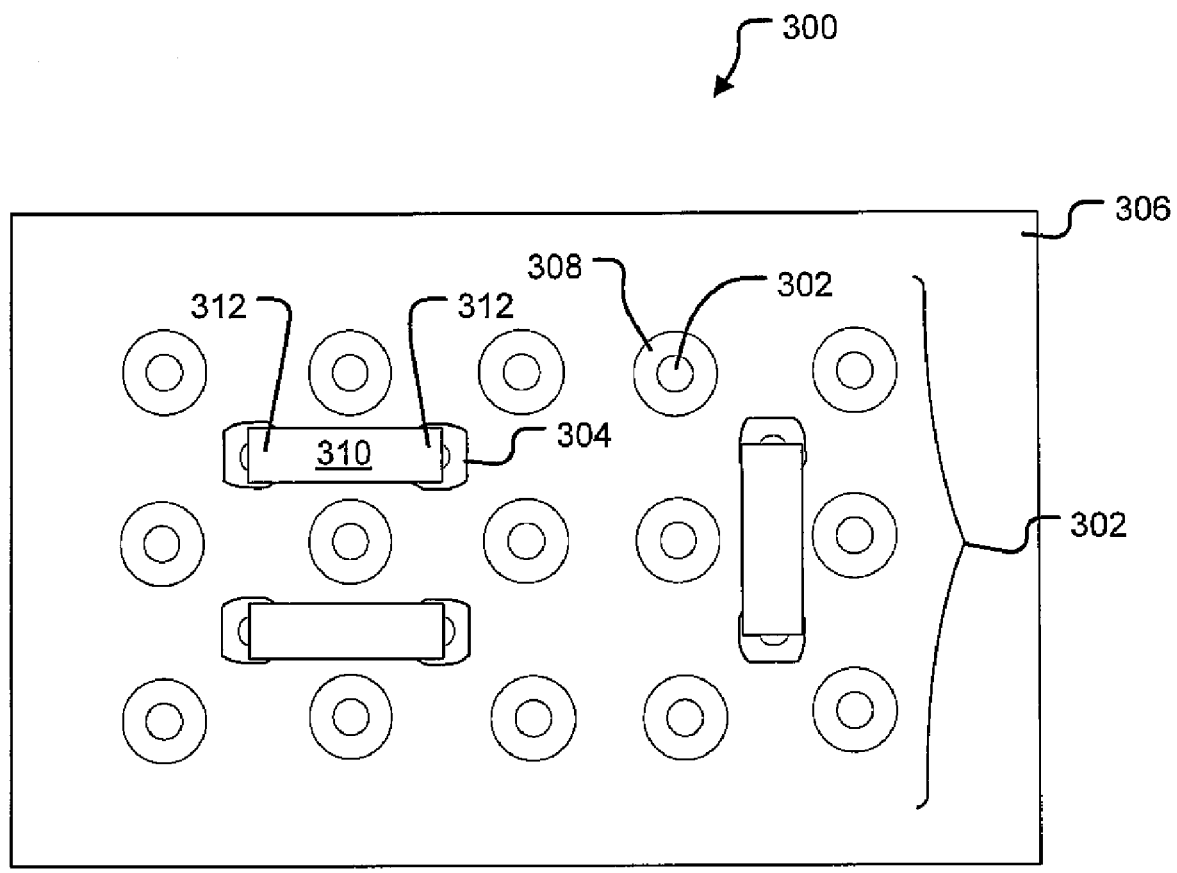
FIG. 3 illustrates a view of an exemplary PCB having electrical terminals and electrical components thereon.

The electrical terminals 204/304 are further designed for receiving electrical components 310 thereon, as shown in FIG. 3. The electrical components 310 may be electrically coupled to the electrical terminals 204/304 by soldering, for example. In this implementation, the end portions 312 (shown also as 120 in FIG. 1) of the electrical components 310 may be dipped in a solder material, such as tin, and may be soldered onto the electrical terminals 304. The electrical components 310 may be positioned across a pair of the electrical terminals 304, bridging and electrically coupling the pair of electrical terminals 304 together. The electrical components 310 themselves may comprise a number of different components, such as resistors, capacitors, or inductors, for example. In some implementations, it may be desirable to use a decoupling capacitor (as electrical component 310) to reduce noise or power filter signals routed on the PCB 306 (such as between vias 302 coupled to signal and ground). Depending upon the design of the electrical circuit, resistors, inductors, or capacitors may be utilized with different advantages.

Figure 4:
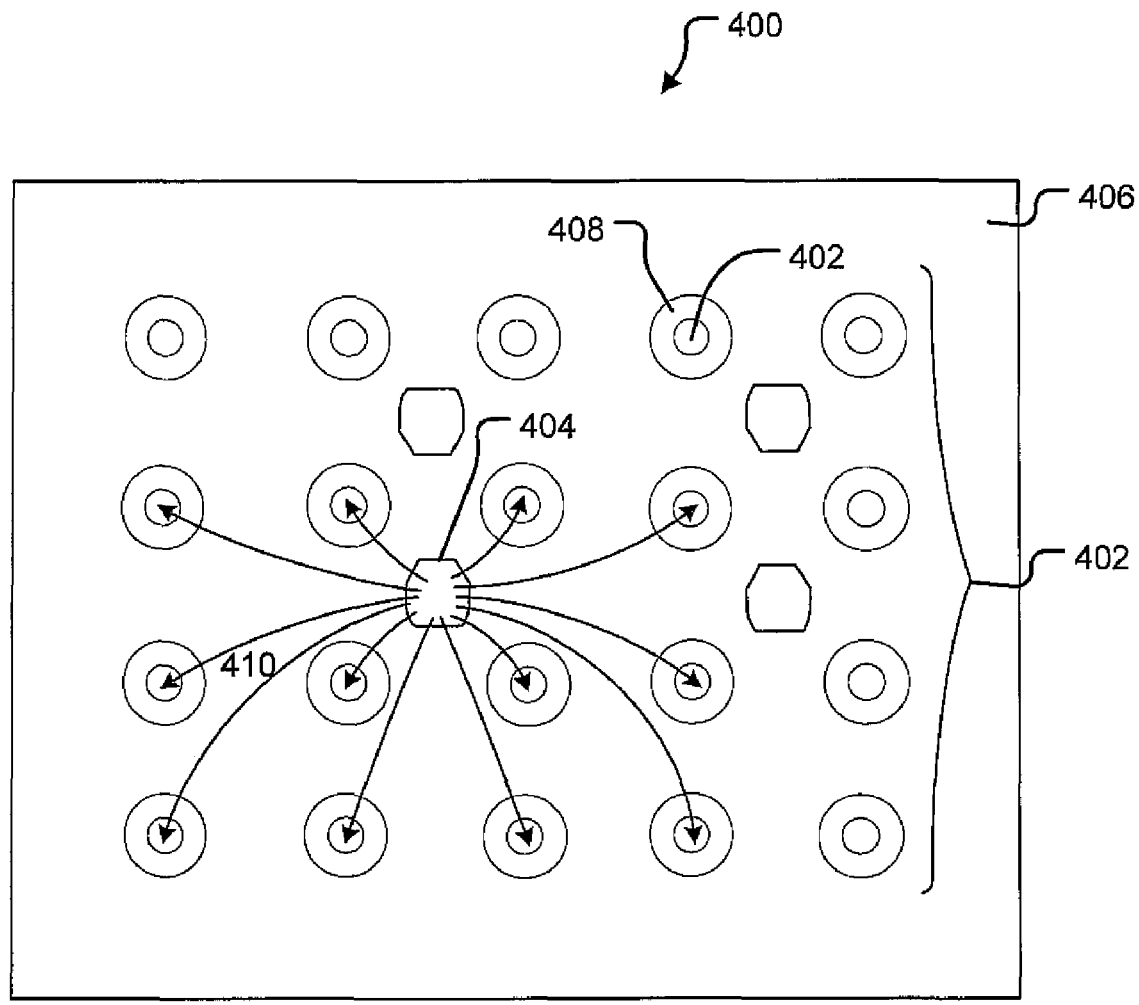
FIG. 4 illustrates a view of an exemplary PCB and some possible electrical connections between an electrical terminal and adjacent vias.

As shown in FIG. 4, positioning the electrical terminal footprints 404 (designed for receiving electrical components 118, 310 thereon) within the array 402 is advantageous for closely routing signals among active components or between adjacent vias 402 on the PCB 406. Arrows 410 in FIG. 4 represent possible electrical connections between an electrical terminal 404 and adjacent vias 402. The electrical terminal 404 may be electrically coupled to a number of adjacent vias 402 to route signals (represented by arrows 410) between the electrical terminal (having an electrical component disposed thereon) and adjacent vias 402 in the array. The electrical terminal footprint 404 can be electrically coupled to any adjacent via 402 using a conductor, such as by forming electrical traces. The electrical components (such as 118 and 310 described above) are not shown in FIG. 4 in order to clarify illustration of possible electrical connections, but these electrical components 118, 310 may be electrically coupled to the electrical terminals 404, thus the electrical components 118, 310 may make the same or similar possible electrical connections (shown as 410) to adjacent vias 402.

With reference now to FIG. 3, positioning the electrical components 310 (on the electrical terminals 304) within the array of vias 302 and closer to active components on the PCB 306 provides a number of advantages for routing signals on the PCB 306, particularly for routing high speed signals. Depending upon the type of electrical components 310 used (i.e. resistor, capacitor, inductor) the placement of the electrical components 310 closer to active components (i.e. within the array of vias 302), rather than on the edges of the PCB 302, reduces signal noise, resistance, or inductance and improves signal quality.

Placing the electrical components 310 within the array of vias 302 without violating the electrical tolerances of the vias 302 has heretofore provided significant challenges. Because space is limited within the array of vias 302, these electrical components 310 were heretofore positioned on the edges of the PCB 306. However, placing the electrical components 310 on the edges of the PCB 306 creates several additional problems, because the signal noise, resistance, and inductance are different between the edges and the center of the PCB 306. Additionally, electrical components 310 become less effective as they are placed father away from the active components. Thus, to provide the best signal quality results, the electrical components 310 should ideally be placed as close to the active components (or within an array of vias 302) as possible. However, placing the electrical components 310 too close to the active components can short circuit the active components and render a PCB 306 defective. The electrical terminal footprints 304 described herein allow placement of the electrical components 310 as close to the active components (array of vias 302) as electrical tolerances will allow.

Additionally, the shape and surface area of the electrical terminals 304 may help to prevent 'tombstoning' of the electrical components 310 during the solder reflow process. During the solder reflow process, surface tensions in the solder can pull small lightweight electrical components 310 in an unwanted direction, sometimes resulting in one end of the electrical component 310 popping or rising up off the PCB, or 'tombstoning.' The irregular hexagonal shape of the electrical terminals 304 minimizes these differences in surface tensions in the solder, thereby reducing the undesirable 'tombstoning' of the electrical components 310.

In one exemplary implementation, a PCB 306 having an array of vias 302 separated by a 1 mm pitch may be utilized. In this example, decoupling capacitors, such as 0.4×02 mm, commonly known as '0402' decoupling capacitors may be used as the electrical components 310 to reduce noise and filter power for high speed signaling. In this implementation, to comply with industry standard guidelines, such as the JEDEC and IPC guidelines, the '0402' decoupling capacitors 310 are positioned at a minimum distance of 0.13 mm or 0.14 mm from a via. In this example, the minimum acceptable distance separating an electrical terminal footprint 304 (having an '0402' decoupling capacitor thereon) and a via is 0.14 mm. This distance is important for preventing short circuiting of the vias 302 and malfunction of the PCB 306. Notably, when PCBs having different pitches are utilized, the minimum acceptable spacing will also be different.

Figure 5:
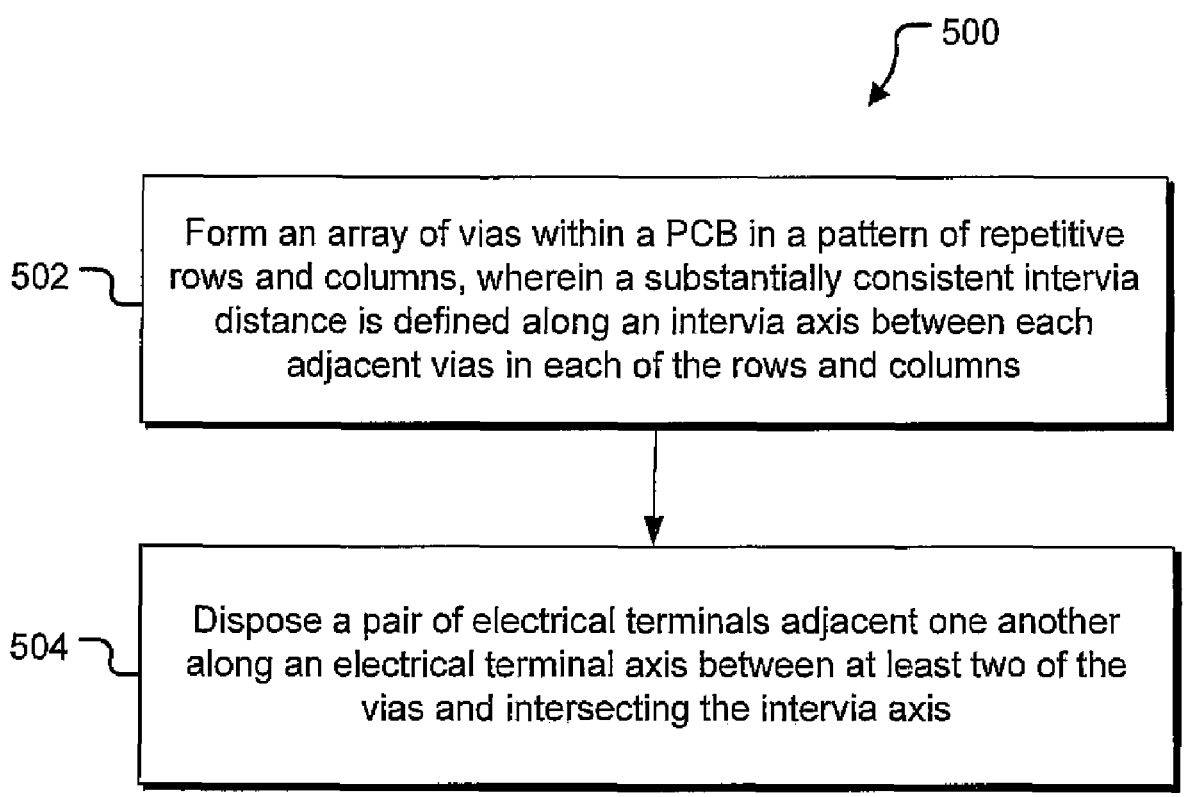
FIG. 5 illustrates an exemplary method of forming a PCB having electrical terminals and electrical components thereon.

In one implementation, a method 500 of forming a PCB having the electrical terminal footprints disposed therein is disclosed and described with reference to FIG. 5. The method 500 of forming a PCB comprises forming 502 an array of vias on the PCB and disposing 504 electrical terminals therein. The array of vias to be formed 502 on the PCB are formed having pads exposed on a side of the PCB opposite the side configured to receive a package, such as a BGA or LGA. The array of vias are formed in a pattern of repetitive rows and columns, as described above. A substantially consistent intervia distance is defined along an intervia axis between each adjacent via in each of the rows and columns.

The method 500 continues by positioning or disposing 504 a pair of electrical terminals on the side of the PCB opposite the side configured to receive the package. The electrical terminals are positioned 504 adjacent one another along an electrical terminal axis between at least two of the vias and intersecting the intervia axis. In some implementations, the electrical terminal axis may be positioned perpendicular to the intervia axis. The electrical terminals may be formed on the PCB as footprints and may be masked, etched, or patterned onto the surface of the PCB. The method may also comprise forming traces on the surface of the PCB to couple the electrical terminals to adjacent vias. The traces may be formed by masking, etching, or patterning, just to name a few examples. The method may further comprise disposing electrical components onto the electrical terminals, such as by soldering to electrically couple the electrical components to the electrical terminals.

Although the subject matter has been described in language specific to structural features and/or methodological arts, it is to be understood that the subject matter defined in the appended claims is not necessarily limited to the specific features or acts descried above. Rather, the specific features and acts described above are disclosed as example forms of implementing the claimed subject matter.

What is claimed is:
1. A printed circuit board (PCB), comprising:
   an array of vias, wherein the array of vias forms a pattern of repetitive rows and columns of vias, wherein intervia distance between each of a plurality of pairs of adjacent vias is substantially constant along all columns and rows; and a pair of electrical terminals disposed on a first side of the PCB opposite a second side of the PCB configured to receive a grid array package, wherein the pair of electrical terminals are positioned adjacent one another along an electrical terminal axis between two of the adjacent vias, wherein the electrical terminal axis intersects the intervia axis between the pair of electrical terminals;

wherein each of the pair of electrical terminals are spaced apart from each of the intervia axes.

2. The PCB of claim 1, wherein the pair of electrical terminals comprise two pads shaped and positioned to form mirror images of one another.

3. The PCB of claim 2, wherein the two pads comprise irregular hexagonal shapes.

4. The PCB of claim 1, wherein each electrical terminal has a surface designed to receive an electrical component thereon to electrically couple the pair of electrical terminals.

5. The PCB of claim 4, wherein the electrical component comprises at least one of a resistor, capacitor, or inductor.

6. The PCB of claim 4, wherein the electrical component comprises at least one decoupling capacitor.

7. The PCB of claim 4, wherein the intervia distance is defined by a 1 mm pitch and the electrical component comprises one or more 0402 decoupling capacitors.

8. The PCB of claim 7, wherein a minimum distance of 0.14 mm separates the 0402 decoupling capacitors from any adjacent via.

9. The PCB of claim 1, wherein the electrical terminal axis is positioned perpendicularly to the intervia axis.

10. The PCB of claim 1, wherein the grid array package comprises a ball grid array (BGA).

11. The PCB of claim 1, wherein each of the vias comprises a pad on the first side of the PCB.

12. A PCB according to claim 1, wherein the intervia distance is determined based on electrical tolerances of the vias.

13. A printed circuit board (PCB), comprising:
an array of vias having respective pads thereon on a first side of the PCB configured to receive a grid array package, and second pads thereon on a second side of the PCB opposite the first side of the PCB, wherein the array of vias forms a pattern of repetitive rows and columns of vias, wherein intervia distance between each of a plurality of pairs of adjacent vias is substantially constant along all columns and rows; and
a pair of electrical terminals disposed on the second side of the PCB, wherein the pair of electrical terminals is positioned adjacent one another along an electrical terminal axis between two of the adjacent vias, wherein the electrical terminal axis intersects the intervia axis between the pair of electrical terminals;
wherein each of the pair of electrical terminals are spaced apart from each of the intervia axes.

14. The PCB of claim 13, wherein the pair of electrical terminals comprise two pads shaped and positioned to form mirror images of one another.

15. The PCB of claim 14, wherein the two pads comprise irregular hexagonal shapes.

16. The PCB of claim 13, wherein each electrical terminal has a surface designed to receive an electrical component thereon to electrically couple the pair of electrical terminals.

17. The PCB of claim 16, wherein the electrical component comprises at least one of a resistor, capacitor, or inductor.

18. The PCB of claim 16, wherein the electrical component comprises at least one decoupling capacitor.

19. The PCB of claim 16, wherein the intervia distance is defined by a 1 mm pitch and the electrical component comprises one or more 0402 decoupling capacitors.

20. The PCB of claim 19, wherein a minimum distance of 0.14 mm separates the 0402 decoupling capacitors from any adjacent via.

21. The PCB of claim 13, wherein the electrical terminal axis is positioned perpendicularly to the intervia axis.

22. The PCB of claim 13, wherein the grid array package comprises a ball grid array (BGA).

23. A printed circuit board (PCB), comprising:
an array of vias arranged in a grid pattern, wherein intervia axes are defined between adjacent vias along individual rows and columns within the grid pattern, wherein intervia distance between each of a plurality of pairs of adjacent vias is substantially constant along all columns and rows; and
a pair of electrical terminals disposed on a first side of the PCB opposite a second side of the PCB configured to receive a grid array package, wherein the pair of electrical terminals are positioned adjacent one another along an electrical terminal axis between two adjacent vias in a column or a row, wherein the electrical terminal axis intersects the intervia axis at a single point between the pair of electrical terminals;
wherein each of the pair of electrical terminals are spaced apart from each of the intervia axes.

24. A printed circuit board (PCB), comprising:
an array of vias, wherein the array of vias forms a pattern of evenly spaced, repetitive rows and columns of vias, wherein intervia distance between each of a plurality of pairs of adjacent vias is substantially constant along all columns and rows;
a pair of electrical terminals disposed on a first side of the PCB opposite a second side of the PCB configured to receive a grid array package and configured to receive an electrical component for connecting the electrical terminals of the pair of the electrical terminals along an electrical terminal axis between two adjacent vias in a column or a row, wherein the pair of electrical terminals are positioned adjacent one another and between two adjacent vias in a column or a row, and wherein the electrical terminal axis intersects the intervia axis at a single point between the pair of electrical terminals;
wherein each of the pair of electrical terminals are spaced apart from each of the intervia axes.

* * * * *